US011047879B2

(12) United States Patent
Fisher et al.

(10) Patent No.: US 11,047,879 B2
(45) Date of Patent: Jun. 29, 2021

(54) PROBE SYSTEMS AND METHODS

(71) Applicant: FormFactor, Inc., Livermore, CA (US)

(72) Inventors: Gavin Neil Fisher, Fenny Compton (GB); Thomas Reiner Thaerigen, Freital (DE); Peter McCann, Beaverton, OR (US); Rodney Jones, Gaston, OR (US); Koby L. Duckworth, Newberg, OR (US)

(73) Assignee: FormFactor, Inc., Livermore, CA (US)

( * ) Notice: Subject to any disclaimer, the term of this patent is extended or adjusted under 35 U.S.C. 154(b) by 89 days.

(21) Appl. No.: 16/600,142

(22) Filed: Oct. 11, 2019

(65) Prior Publication Data

US 2020/0041544 A1    Feb. 6, 2020

Related U.S. Application Data

(62) Division of application No. 15/708,681, filed on Sep. 19, 2017, now Pat. No. 10,459,006.
(Continued)

(51) Int. Cl.
  *G01R 31/01*    (2020.01)
  *G01R 1/067*    (2006.01)
  (Continued)

(52) U.S. Cl.
  CPC ..... *G01R 1/06794* (2013.01); *G01R 31/2891* (2013.01); *G01R 35/00* (2013.01); *G01R 1/07364* (2013.01)

(58) Field of Classification Search
  CPC .... G01R 35/005; G01R 27/32; G01R 1/0408; G01R 1/06705; G01R 1/07307;
  (Continued)

(56) References Cited

U.S. PATENT DOCUMENTS 6,396,296 B1    5/2002 Tarter et al.
7,023,225 B2    4/2006 Blackwood
(Continued)

FOREIGN PATENT DOCUMENTS

JP    2008-298487    11/2008
TW    M486058 U    9/2014
WO    WO2006/083862    8/2006

OTHER PUBLICATIONS

English-language abstract of JP2008-298487, Nov. 12, 2008.
(Continued)

*Primary Examiner* — Vincent Q Nguyen
(74) *Attorney, Agent, or Firm* — Dascenzo Gates Intellectual Property Law, P.C.

(57) ABSTRACT

Probe systems and methods are disclosed herein. The methods include directly measuring a distance between a first manipulated assembly and a second manipulated assembly, contacting first and second probes with first and second contact locations, providing a test signal to an electrical structure, and receiving a resultant signal from the electrical structure. The methods further include characterizing at least one of a probe system and the electrical structure based upon the distance. In one embodiment, the probe systems include a measurement device configured to directly measure a distance between a first manipulated assembly and a second manipulated assembly. In another embodiment, the probe systems include a probe head assembly including a platen, a manipulator operatively attached to the platen, a vector network analyzer (VNA) extender operatively attached to the manipulator, and a probe operatively attached to the VNA extender.

17 Claims, 6 Drawing Sheets

Related U.S. Application Data

(60) Provisional application No. 62/400,978, filed on Sep. 28, 2016.

(51) Int. Cl.
  *G01R 35/00* (2006.01)
  *G01R 31/28* (2006.01)
  *G01R 1/073* (2006.01)

(58) Field of Classification Search
  CPC .......... G01R 31/2806; G01R 31/2822; G01R 31/2851; G01R 31/2889; G01R 31/2894; G01R 31/2896; G01R 31/31907; G01D 18/00; G01Q 10/045; G01Q 10/065; G01Q 20/04; G01Q 60/22; G01Q 70/06
  USPC .......... 324/750.17–750.19, 750.22, 750.25, 324/756.01
  See application file for complete search history.

(56) References Cited

U.S. PATENT DOCUMENTS

| | | | |
|---|---|---|---|
| 7,130,756 | B2 | 10/2006 | Heuermann |
| 7,748,623 | B2 | 7/2010 | Barber |
| 7,764,079 | B1 | 7/2010 | Daoudi et al. |
| 7,908,107 | B2 | 3/2011 | Hayden |
| 8,013,623 | B2 | 9/2011 | Burcham et al. |
| 8,479,308 | B2 | 7/2013 | Nishimura et al. |
| 2006/0212248 | A1 | 9/2006 | Kiesewetter et al. |
| 2016/0184996 | A1 | 6/2016 | Ishige et al. |

OTHER PUBLICATIONS

Hayden, Leonard, *A Hybrid Probe-Tip Calibration for Multiport Vector Network Analyzers*, IEEE 68$^{th}$ ARFTG, Dec. 2006.
English-language translation of TW M486058 U, Sep. 11, 2014.
Rumiantsev, Andrej et al., *Achieving Metrology-Level Accuracy When Making THz Measurements*, Microwave Journal, Sep. 2016.
Von Kleist-Retzow, F.T., *Automated Calibration of RF On-Wafer Probing and Evaluation of Probe Misalignment Effects Using a Desktop Micro-Factory*, Journal of Computer and Communications, Mar. 2016.

PROBE SYSTEMS AND METHODS

RELATED APPLICATIONS

This application is a divisional patent application that claims priority to U.S. patent application Ser. No. 15/708,681, entitled PROBE SYSTEMS AND METHODS, which was filed on Sep. 19, 2017 and issued as U.S. Pat. No. 10,459,006 on Oct. 29, 2019, which claims priority to U.S. Provisional Patent Application No. 62/400,978, entitled PROBE SYSTEMS AND METHODS, which was filed on Sep. 28, 2016, and the complete disclosures of which are hereby incorporated by reference.

FIELD OF THE DISCLOSURE

The present disclosure is directed generally to probe systems and methods, and more particularly to probe systems that include an electronic component mounted to a manipulator, to probe systems that include direct distance measurement between two manipulated assemblies, and/or to methods of operating the probe systems that include direct distance measurement between the two manipulated assemblies.

BACKGROUND OF THE DISCLOSURE

Probe systems may be utilized to test the operation of a device under test (DUT), such as a semiconductor device and/or an integrated circuit device. As these devices become smaller, and their operating frequencies increase, physical distances that test signals must travel become increasingly important and/or have an increasingly significant impact on test results. For millimeter wave (mmW) tests, which generally are performed at frequencies between 30 gigahertz (GHz) and 300 GHz, signal path distances generally must be accounted for, and shorter signal paths generally produce more accurate test results.

It is known to calibrate probe systems in order to validate, or to improve the accuracy of, test results. In certain testing scenarios, such as mmW tests, calibration and/or test results may be significantly impacted by a distance, or an assumed distance, between probes that are utilized to carry out the calibration and/or the tests. In addition, variation of the distance between the probes during calibration, as compared to during testing, may significantly impact the accuracy of the calibration, as applied to the test results. Additionally or alternatively, a distance between the DUT and one or more electronic components of the probe system may limit the effectiveness of the probe system. Thus, there exists a need for improved probe systems and methods.

SUMMARY OF THE DISCLOSURE

Probe systems and methods are disclosed herein. The methods include operatively aligning a first probe of a first manipulated assembly with a first contact location of an electrical structure and operatively aligning a second probe of a second manipulated assembly with a second contact location of the electrical structure. The methods also include directly measuring a distance between the first manipulated assembly and the second manipulated assembly, contacting first and second probes with first and second contact locations, providing a test signal to the electrical structure, and receiving a resultant signal from the electrical structure. The methods further include characterizing at least one of a probe system and the electrical structure based upon the distance between the first manipulated assembly and the second manipulated assembly.

In one embodiment, the probe systems include a chuck with a support surface configured to support a substrate that includes a device under test (DUT). In these embodiments, the probe systems also include a probe head assembly. The probe head assembly includes a platen, a first manipulator operatively attached to the platen, and a first manipulated assembly operatively attached to the first manipulator and including a first probe configured to contact the DUT. The probe head assembly also includes a second manipulator operatively attached to the platen and a second manipulated assembly operatively attached to the second manipulator and including a second probe configured to contact the DUT. In these embodiments, the probe system also includes a measurement device configured to directly measure a distance between the first manipulated assembly and the second manipulated assembly.

In another embodiment, the probe systems include a probe head assembly including a platen and a manipulator including a manipulator mount, which is operatively attached to the platen, and a probe mount. The manipulator is configured to selectively and operatively translate the probe mount relative to the manipulator mount. The probe head assembly also includes a vector network analyzer (VNA) extender operatively attached to the probe mount of the manipulator and a probe operatively attached to the probe mount via the VNA extender such that the manipulator is configured to operatively translate both the VNA extender and the probe relative to the manipulator mount via motion of the probe mount. In these embodiments, the probe systems also include a chuck having a support surface configured to support a substrate that includes a DUT, and the probe faces toward the support surface to permit selective electrical contact between the probe and the DUT. In these embodiments, the probe system further includes a vector network analyzer configured to at least one of provide a test signal to the VNA extender and receive a resultant signal from the VNA extender.

DETAILED DESCRIPTION AND BEST MODE OF THE DISCLOSURE

Figure 1:
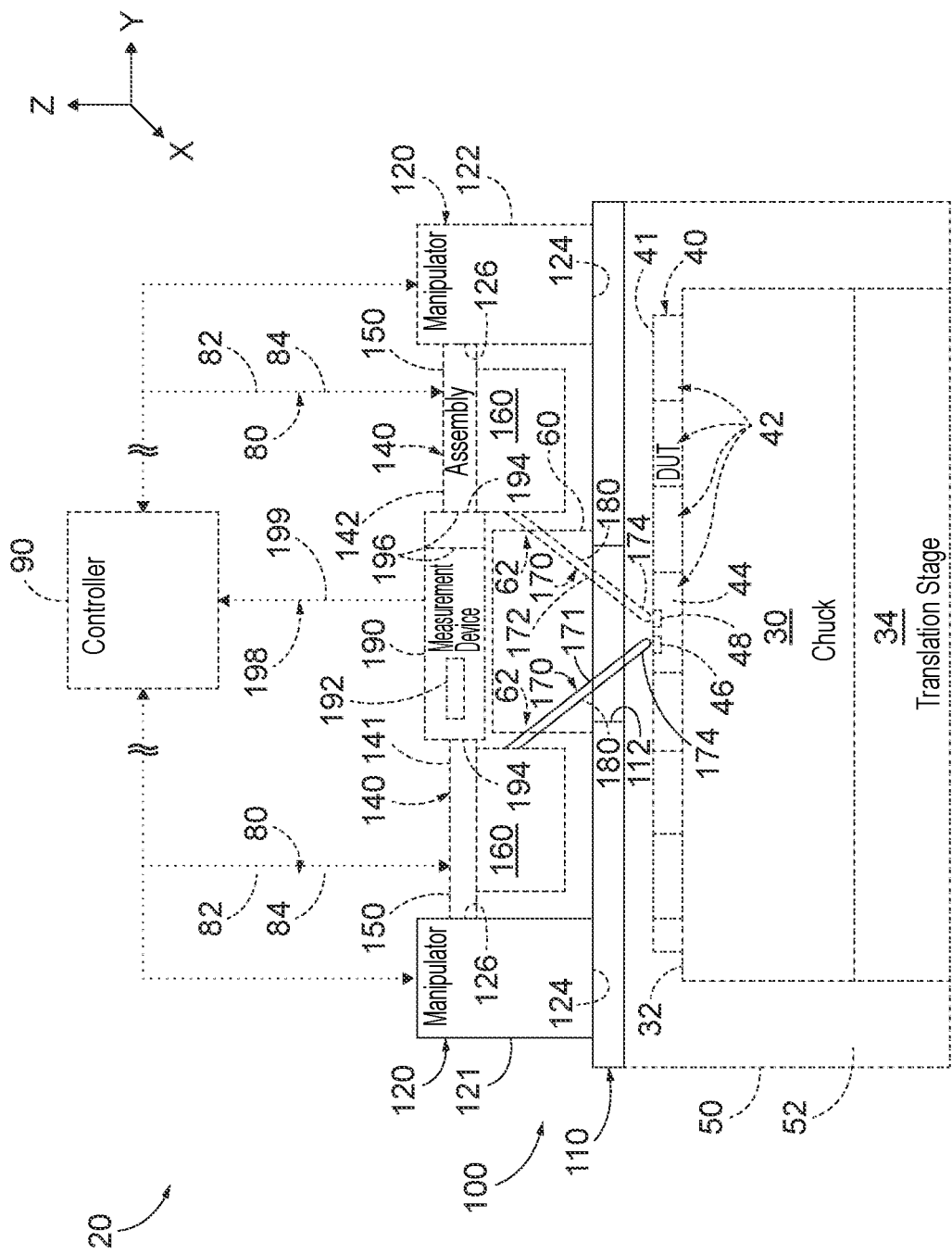
FIG. 1 is a schematic illustration of examples of probe systems according to the present disclosure.

FIGS. 1-6 provide examples of probe systems 20, according to the present disclosure, of components of probe systems 20, and/or of methods 300, according to the present disclosure, of utilizing probe systems, such as probe systems 20. Elements that serve a similar, or at least substantially similar, purpose are labeled with like numbers in each of FIGS. 1-6, and these elements may not be discussed in detail herein with reference to each of FIGS. 1-6. Similarly, all elements may not be labeled in each of FIGS. 1-6, but reference numerals associated therewith may be utilized herein for consistency. Elements, components, and/or features that are discussed herein with reference to one or more of FIGS. 1-6 may be included in and/or utilized with any of FIGS. 1-6 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

Figure 2:
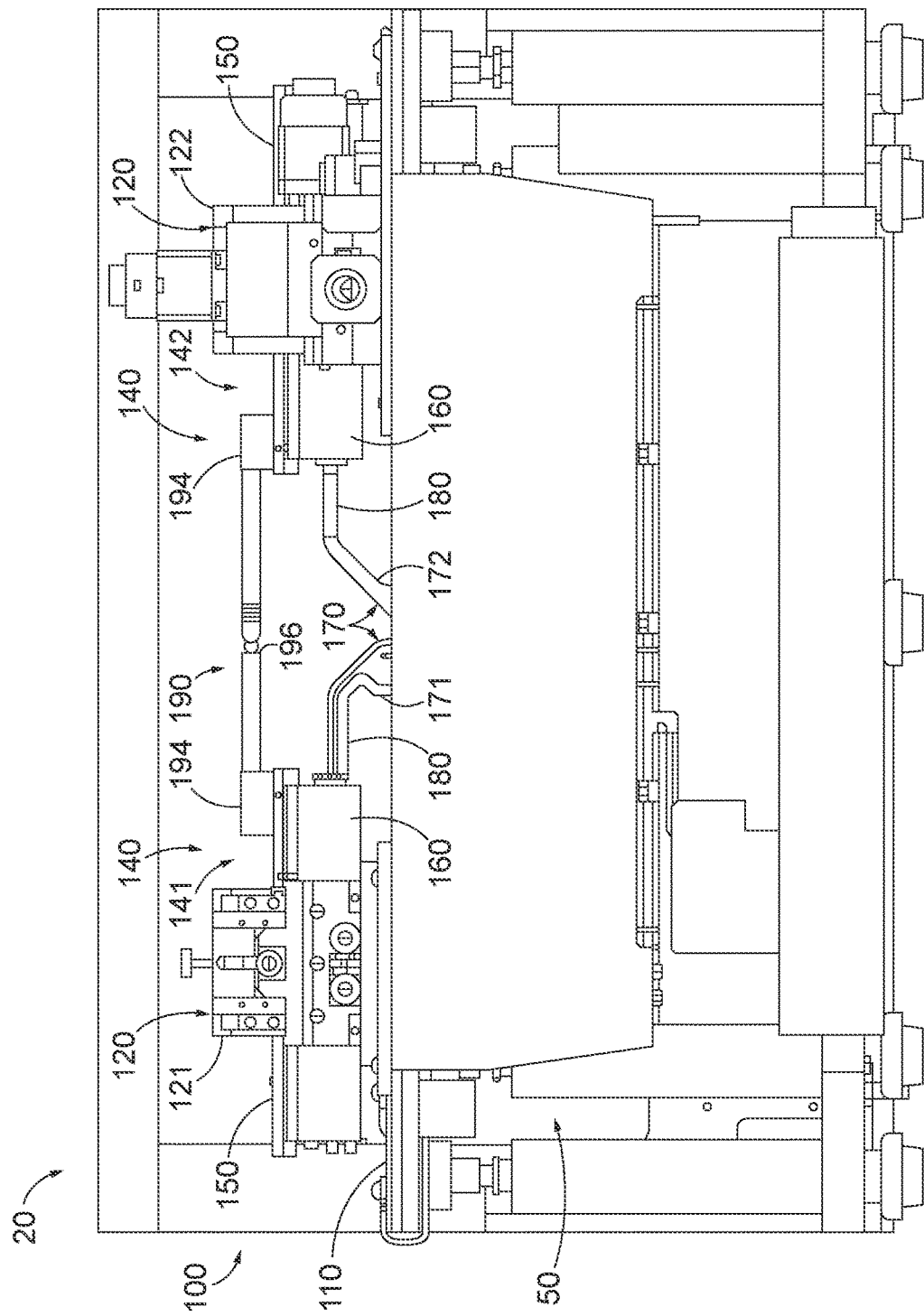
FIG. 2 is a less schematic front view illustrating an example of a probe system according to the present disclosure.
Figure 3:
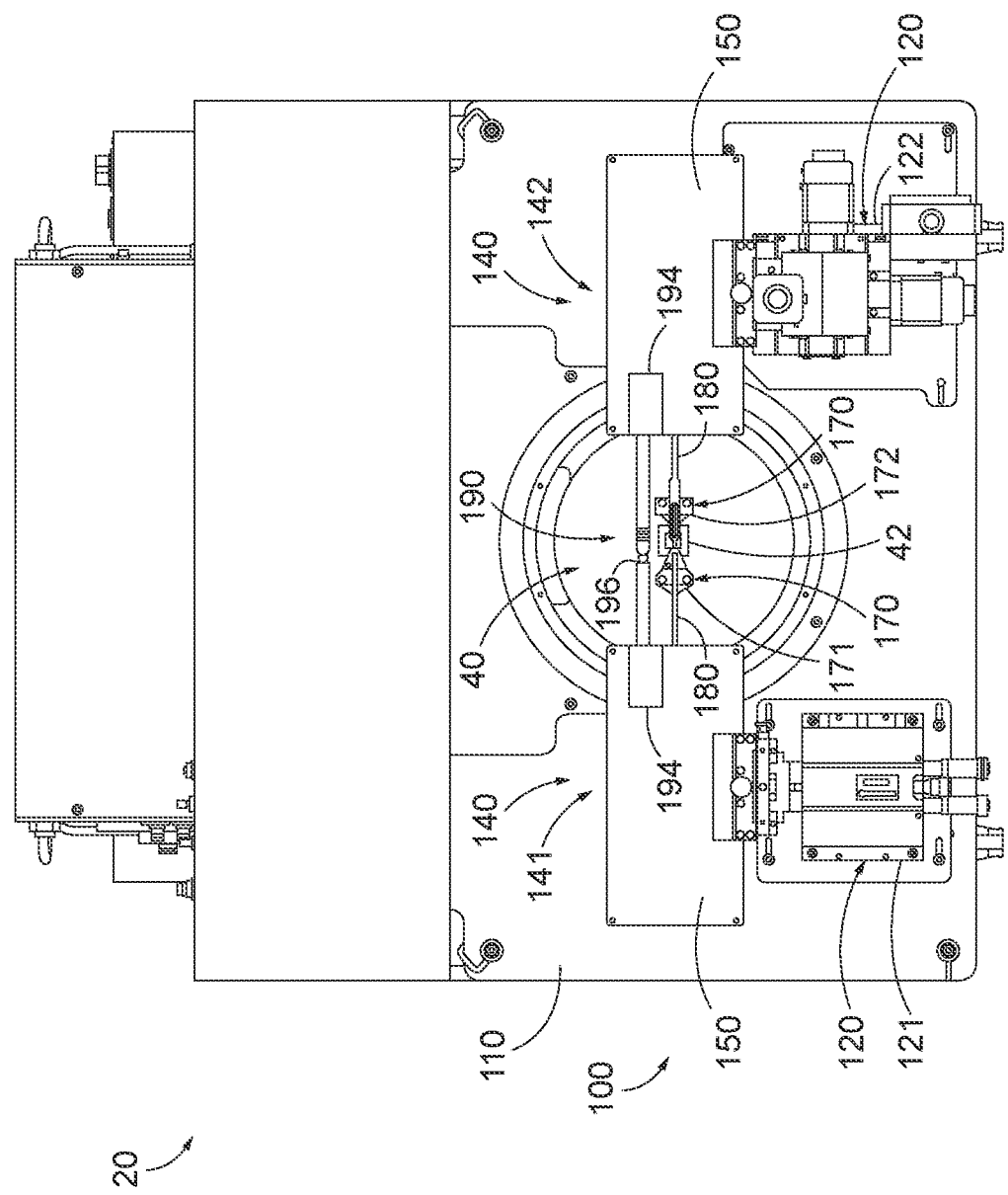
FIG. 3 is a top view of the probe system of FIG. 2.

FIG. 1 is a schematic illustration of examples of probe systems 20 according to the present disclosure, while FIGS. 2-5 provide less schematic examples of probe systems 20 and/or components thereof. As illustrated schematically in FIG. 1 and less schematically by FIGS. 2-5, probe systems 20 include a probe head assembly 100 including a platen 110. Probe head assemblies 100 include a manipulator 120 and may include a plurality of manipulators 120, such as at least a first manipulator 121 and a second manipulator 122, as illustrated in FIGS. 1-3. Each manipulator 120 may include a manipulator mount 124 and a probe mount 126, as illustrated in FIG. 1. Manipulator mount 124 may be operatively attached to, or may operatively attach corresponding manipulator 120 to, platen 110. In FIGS. 1-3, one or two manipulators 120 are illustrated; however, it is within the scope of the present disclosure that probe systems 20 may include more than two manipulators 120. As examples, probe systems 20 may include three, four, five, six, or more than six manipulators 120.

As illustrated collectively by FIGS. 1-5, probe systems 20 also include a manipulated assembly 140, and a corresponding manipulated assembly 140 may be associated with, operatively attached to, and/or manipulated by, each manipulator 120. As an example, each manipulated assembly 140 may be operatively attached to a corresponding probe mount 126 of a corresponding manipulator 120, and the corresponding manipulator may be configured to selectively and operatively translate the probe mount relative to the manipulator mount. As another example, a first manipulated assembly 141 may be associated with, operatively attached to, and/or manipulated by first manipulator 121. Similarly, a second manipulated assembly 142 may be associated with, operatively attached to, and/or manipulated by second manipulator 122. First manipulator 121 and second manipulator 122 may be configured to be independently actuated and/or to selectively and operatively translate first manipulated assembly 141 and second manipulated assembly 142 relative to one another.

Each manipulated assembly 140 may include, or be, a corresponding probe 170. As an example, a first probe 171 may be associated with, operatively attached to, and/or manipulated by first manipulator 121. Similarly, a second probe 172 may be associated with, operatively attached to, and/or manipulated by second manipulator 122.

Manipulated assemblies 140 also may include an electronic component 160. Electronic component 160 also may be referred to herein as, or may be, a vector network analyzer (VNA) extender 160, a spectrum analyzer extender 160, and/or a signal analyzer extender 160. The following discussion generally will refer to VNA extender 160; however, it is to be understood that the VNA extender may include and/or instead may be the electronic component, the spectrum analyzer extender, and/or the signal analyzer extender. VNA extender 160, when present, may be operatively attached to a corresponding probe mount 126 of a corresponding manipulator 120, and a corresponding probe 170 may be operatively attached to the corresponding manipulator via the VNA extender. As such, VNA extender 160 and the corresponding probe 170 both may be configured to selectively and operatively translate relative to manipulator mount 124, or platen 110, via manipulation of corresponding manipulator 120 and/or via motion of corresponding probe mount 126.

As illustrated in dashed lines in FIG. 1, probe systems 20 also may include a chuck 30 that includes a support surface 32. Support surface 32 may be configured to support a substrate 40, and substrate 40 may include one or more devices under test (DUTs) 42 and/or one or more test structures 44. Probe system 20 further may include a translation stage 34, which may be configured to operatively translate chuck 30 along an X-axis, a Y-axis, and/or a Z-axis. Additionally or alternatively, translation stage 34 also may be configured to rotate chuck 30 about the X-axis, the Y-axis, and/or the Z-axis.

As also illustrated in dashed lines in FIG. 1, probe system 20 may include a controller 90. Controller 90 also may be referred to herein as, may include, and/or may be a control system 90 and/or a signal generation and analysis assembly 90 and may be configured to test and/or quantify the operation of DUT 42. As an example, the controller may be configured to provide a test signal 82 to the DUT and/or to receive a resultant signal 84 from the DUT. The test signal and/or the resultant signal may be conveyed between control system 90 and DUT 42 via probe head assembly 100, via chuck 30, and/or via a data cable 80 that extends between the control system and the probe head assembly.

As illustrated in FIG. 1, probes 170 may face toward support surface 32 of chuck 30 such that the probes may contact, or electrically contact, DUT 42. As an example, first probe 171 may contact a first contact location 46 on DUT 42. As another example, second probe 172 may contact a second contact location 48 on DUT 42. This contact may be selectively established and/or disrupted via motion of chuck 30, such as via actuation of translation stage 34, and/or via motion of probes 170, such as via actuation of manipulators 120.

VNA extender 160, when present, may be configured to receive test signal 82 from controller 90 at a first frequency and to provide the test signal to probe 170 at a second frequency that is greater than the first frequency. As such, VNA extender 160 may extend the operating frequency range of controller 90. Examples of the first frequency include frequencies of at most 10 gigahertz (GHz), at most 20 GHz, at most 30 GHz, at most 40 GHz, at most 50 GHz, at most 60 GHz, at most 70 GHz, and/or at most 80 GHz. Examples of the second frequency include frequencies of at least 50 GHz, at least 60 GHz, at least 70 GHz, at least 80 GHz, at least 90 GHz, at least 100 GHz, at least 200 GHz, at least 300 GHz, at most 1,000 GHz, at most 800 GHz, at most 600 GHz, at most 500 GHz, at most 400 GHz, at most 300 GHz, and/or at most 200 GHz.

The proximity of VNA extender 160 to DUT 42, when compared to the proximity of controller 90 to the DUT, may permit and/or facilitate the increase in the frequency of the test signal. As such, it may be desirable to position VNA extender 160 as close to DUT 42 as possible, and probe systems 20 may be configured to facilitate this close proximity between the VNA extender and the probe. As an example, data cable 80 may define a first signal transmission length between controller 90 and VNA extender 160, and probe system 20 also may define a second signal transmission length between VNA extender 160 and a probe tip 174 of probe 170. Under these conditions, probe system 20 may be configured such that the second signal transmission length is less than a threshold fraction of the first signal transmission length. Examples of the threshold fraction include threshold fractions of less than 10%, less than 5%, less than 1%, less than 0.5%, less than 0.1%, less than 0.05%, or less than 0.01% of the first signal transmission length.

It is within the scope of the present disclosure that probe head assembly 100 further may include additional structure and/or structures that may be utilized to move VNA extender 160 closer to DUT 42, to decrease a distance between the VNA extender and the DUT, and/or to decrease the second signal transmission length. As an example, and as illustrated in dashed lines in FIG. 1 and in solid lines in FIGS. 2-5, probe head assembly 100 may include a VNA extender mounting plate 150. VNA extender mounting plate 150 may be operatively, or even directly, attached to probe mount 126, and VNA extender 160 may be operatively, or even directly, attached to the probe mount via the VNA extender mounting plate. Additionally or alternatively, VNA extender 160 may be operatively attached to a surface of VNA extender mounting plate 150 that faces toward support surface 32 of chuck 30 and/or toward DUT 42. Stated another way, VNA extender 160 may extend at least partially between VNA extender mounting plate 150 and support surface 32 and/or DUT 42.

In such a configuration, and as illustrated, VNA extender 160 may be positioned in close proximity to platen 110 and/or may be positioned in close proximity to, or even over, an aperture 112 within platen 110. This may decrease a distance between the VNA extender and the DUT and/or decrease a length of the second signal transmission length that is needed to electrically interconnect the VNA extender and the DUT when compared to probe systems that are not configured as illustrated in FIGS. 1-5.

As illustrated, VNA extender mounting plate 150 may be directly and/or operatively attached to probe mount 126. Similarly, VNA extender 160 may be directly and/or operatively attached to VNA extender mounting plate 150. In addition, probe 170 may be directly and/or operatively attached to VNA extender 160.

As illustrated in dashed lines in FIG. 1, and in solid lines in FIGS. 2-5, probe 170 may include a waveguide 180. Waveguide 180, when present, may extend between, may electrically interconnect, and/or may mechanically interconnect VNA extender 160 and probe 170 and/or a probe tip 174 of probe 170. Waveguide 180 may be a rigid, or at least substantially rigid, waveguide 180 that maintains a fixed, or at least substantially fixed, relative orientation between probe tip 174 and VNA extender 160, and manipulator 120 may be configured to selectively and operatively translate waveguide 180 relative to manipulator mount 124 via motion of probe mount 126.

As illustrated schematically in dashed lines in FIG. 1 and less schematically in solid lines in FIGS. 2-3, probe system 20 may include a measurement device 190. Measurement device 190, when present, may be adapted, configured, designed, sized, and/or constructed to detect, measure, directly detect, and/or directly measure a distance between first manipulated assembly 141 and second manipulated assembly 142. In general, the distance between the first manipulated assembly and the second manipulated assembly may be measured in a direction that is parallel, or at least substantially parallel, to an upper surface 41 of substrate 40, as illustrated in FIG. 1.

This may include measuring any suitable distance between any suitable portion, component, and/or region of the first manipulated assembly and any suitable portion, component, and/or region of the second manipulated assembly. Examples of suitable components of the first manipulated assembly and/or of the second manipulated assembly include one or more of VNA extender mounting plate 150, VNA extender 160, probe 170, probe tip 174, and/or waveguide 180. As an example, measurement device 190 may measure the distance between probe 170 of first manipulated assembly 141 and probe 170 of second manipulated assembly 142. As another example, and when manipulated assemblies 140 include VNA extender mounting plates 150, measurement device 190 may measure the distance between VNA extender mounting plate 150 of first manipulated assembly 141 and VNA extender mounting plate 150 of second manipulated assembly 142.

Measurement device 190 may include any suitable structure. As examples, measurement device 190 may include one or more of a micrometer, a caliper, a capacitive probe, an optical encoder, and/or an interferometer. As another example, measurement device 190 may include, or be, an electronic measurement device. As yet another example, and as illustrated in FIG. 1, measurement device 190 may include a display 192 configured to indicate the distance between the first manipulated assembly and the second manipulated assembly.

Measurement device 190 may measure the distance between first manipulated assembly 141 and second manipulated assembly 142 in any suitable manner. As an example, and as illustrated in FIG. 1, first manipulated assembly 141 may include a measurement device mount 194, and measurement device 190 may be operatively attached, or mounted, to the measurement device mount. In addition, second manipulated assembly 142 may include a striker surface 196, and measurement device 190 may be configured to operatively contact striker surface 196 to measure the distance between the first manipulated assembly and the second manipulated assembly. Additionally or alternatively, and as illustrated in FIGS. 1-3, striker surface 196 may be operatively attached to the second manipulated assembly, such as via a corresponding measurement device mount 194. Thus, the distance between the first manipulated assembly and the second manipulated assembly may include, be, and/or be based upon, the distance between the measurement device mount and the striker surface.

It is within the scope of the present disclosure that measurement device 190 may extend between and/or operatively contact both first manipulated assembly 141 and second manipulated assembly 142. As an example, measurement device mount 194 may operatively attach the measurement device, or at least a portion of the measurement device, to first manipulated assembly 141 and/or to second manipulated assembly 142. Examples of measurement device mount 194 include any suitable mechanical mount, fastener, fastening assembly, vacuum surface, and/or vacuum mount.

However, this is not required. As an example, and as discussed, measurement device 190 may include an interferometer and/or another light-based, or laser-based, measurement device. Under these conditions, measurement device 190 need not physically touch first manipulated assembly 141 and/or second manipulated assembly 142 but still will quantify the distance between the first manipulated assembly and the second manipulated assembly.

Measurement device 190 may include and/or be a single measurement device. Additionally or alternatively, measurement device 190 may not be integral with first manipulator 121 and/or second manipulator 122. Such a configuration may improve measurement accuracy over a system that, for example, measures motion of first manipulator 121, separately measures motion of second manipulator 122, and indirectly calculates the distance between the first manipulated assembly and the second manipulated assembly based upon these distinct and/or independent measurements.

It is within the scope of the present disclosure that the distance between the first manipulated assembly and the second manipulated assembly may include, or be, any suitable distance that is representative of an absolute, or relative, distance between probe tip 174 of first probe 171 and probe tip 174 of second probe 172. As an example, the distance may be a direct measure of the distance between the probe tips. As another example, the distance may be an indirect measure of the distance between the probe tips. As yet another example, the distance may not necessarily be the absolute distance between the probe tips but instead may be a relative measure of the relative distance between the probe tips, and such a relative measure may be utilized to determine, establish, and/or quantify changes in the distance between the probe tips.

As discussed herein, probe systems 20 may include controller 90. When probe systems 20 include both controller 90 and measurement device 190, measurement device 190 may be configured to generate a distance signal 199, which may be indicative of the distance between the first manipulated assembly and the second manipulated assembly. Under these conditions, probe systems 20 further may include a signal conveyance structure 198, which may be configured to convey the distance signal from the measurement device to the controller. Examples of the signal conveyance structure include any suitable signal conveyance wire, signal conveyance fiber optic cable, wired signal conveyance structure, and/or wireless signal conveyance structure. Controller 90, when present, may be adapted, configured, and/or programmed to control the operation of probe systems 20, such as by performing any suitable portion of methods 300, which are discussed in more detail herein with reference to FIG. 6. This control may be based, at least in part, on distance signal 199.

Probe systems 20 that include measurement device 190 may provide several benefits over conventional probe systems, which do not measure, or at least directly measure, the distance between the first manipulated assembly and the second manipulated assembly. As an example, and under certain conditions, it may be desirable to accurately know, or quantify, the distance between probe tips 174 that are utilized to contact first contact location 46 and second contact location 48 of test structure 44 that is illustrated in FIG. 1. Additionally or alternatively, it also may be desirable to maintain the distance between probe tips 174 over a series of measurements, at a series of different measurement temperatures, and/or despite thermal drift of probe systems 20. Under these conditions, probe systems 20, which are disclosed herein, may permit more accurate measurement of the distance between the probe tips and/or may permit the probe tips to be more accurately maintained at a desired separation distance when compared to more conventional probe systems.

As a more specific example, and prior to performing millimeter wave (mmW) measurements, a probe system may be calibrated by contacting a series of different test structures 44, such as a thru, an open, a short, an electrically conductive trace, and/or a series of lines with precisely known dimensions. Under these conditions, it may be beneficial to maintain the distance between the probe tips fixed, or at least substantially fixed, and/or to account for variations in the distance between the probe tips as the probe tips are utilized to contact the various test structures, and probe systems 20 may permit and/or facilitate improved calibration via direct measurement of the distance between the probe tips utilizing measurement device 190.

Figure 4:
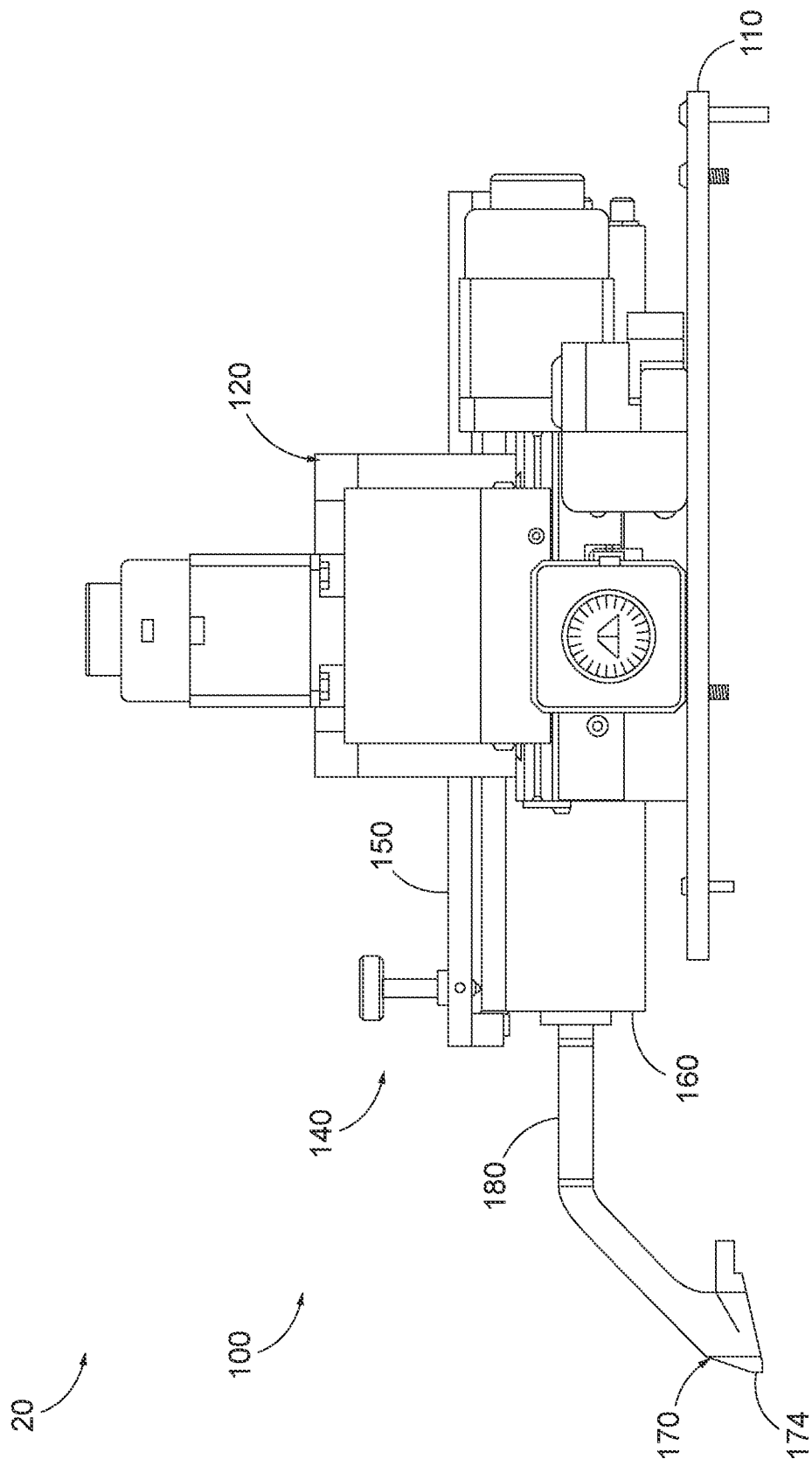
FIG. 4 is an illustration of a portion of the probe system of FIG. 2.
Figure 5:
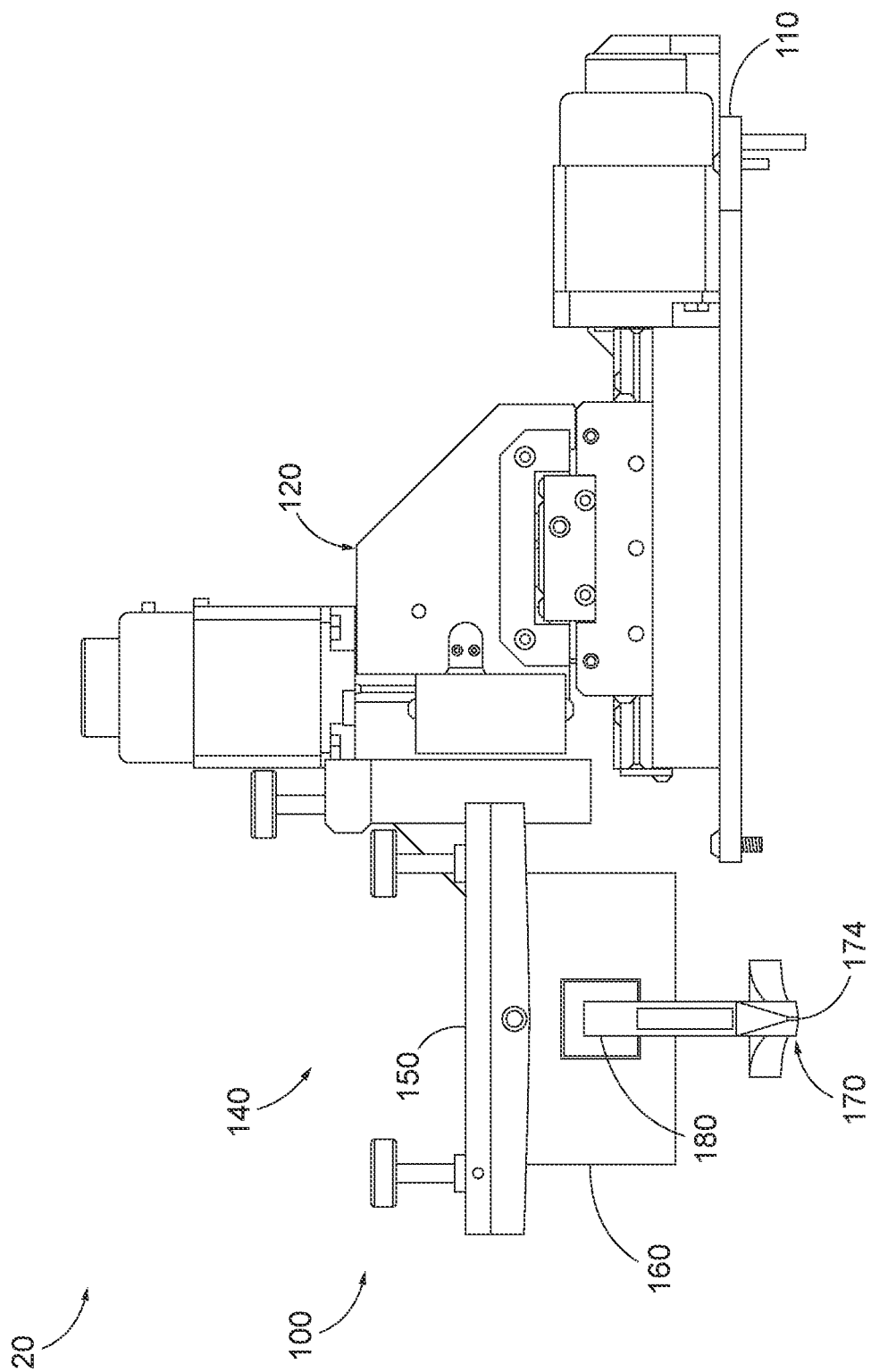
FIG. 5 is an illustration of a portion of the probe system of FIG. 2.

Manipulators 120 may include any suitable structure that may be adapted, configured, designed, and/or constructed to selectively and operatively translate a corresponding probe mount 126 relative to a corresponding manipulator mount 124 and/or to selectively and operatively translate a corresponding manipulated assembly 140 relative to platen 110. As examples, manipulators 120 may include one or more of a manually actuated manipulator, a mechanically actuated manipulator, an electrically actuated manipulator, a lead screw and nut assembly, a ball screw and nut assembly, a rack and pinion assembly, a linear actuator, a rotary actuator, and/or a stepper motor. FIGS. 2-3 illustrate first manipulator 121 as the manually actuated manipulator and second manipulator 122 as the electrically actuated manipulator. FIGS. 4-5 illustrate manipulator 120 as the electrically actuated manipulator. Probe systems 20 may include any suitable combination of manually and/or electrically actuated manipulators 120.

Manipulators 120 may be configured to provide motion in any suitable direction. As an example, manipulators 120 may be configured to selectively and operatively translate the corresponding probe mount and/or the corresponding manipulated assembly along the X-axis, the Y-axis, and/or the Z-axis of FIG. 1. Additionally or alternatively, manipulators 120 may be configured to selectively and operatively pivot, or rotate, the corresponding probe mount and/or the corresponding manipulated assembly about the X-axis, the Y-axis, and/or the Z-axis. Such pivoting, or rotating, also may be referred to herein as yaw, pitch, and roll adjustments. The X-axis may be parallel, or at least substantially parallel, to support surface 32 of chuck 30, while the Y-axis may be parallel, or at least substantially parallel, to the support surface but perpendicular to the X-axis. The Z-axis may be perpendicular, or at least substantially perpendicular, to the X-axis, to the Y-axis, and/or to the support surface.

Probes 170, such as first probe 171 and/or second probe 172, may include any suitable structure that may be adapted, configured, designed, and/or constructed to operatively, electrically, and/or mechanically contact substrate 40, DUT 42, test structure 44, first contact location 46, and/or second contact location 48. As examples, probes 170 may include one or more of a needle probe, a test head, and/or a probe head that includes a plurality of respective probes. Each probe 170 may include at least one corresponding probe tip 174.

As illustrated in dashed lines in FIG. 1, probe systems 20 may include a lower enclosure 50 and/or an upper enclosure 60. Lower enclosure 50, when present, may at least partially define and/or bound an enclosed volume 52, and chuck 30 and/or support surface 32 thereof may be positioned within the enclosed volume. Stated another way, lower enclosure 50 may surround, house, and/or contain at least a portion of chuck 30, such as a portion of chuck 30 that defines support surface 32.

Upper enclosure 60, when present, also may at least partially define and/or bound enclosed volume 52 and may include an aperture 62. Manipulators 120 and at least a portion of manipulated assemblies 140, such as VNA extenders 160, may be external to enclosed volume 52. In addition, at least a portion of a given probe 170 and/or waveguide 180 may extend through aperture 62 such that a corresponding probe tip 174 is positioned within the enclosed volume.

Figure 6:
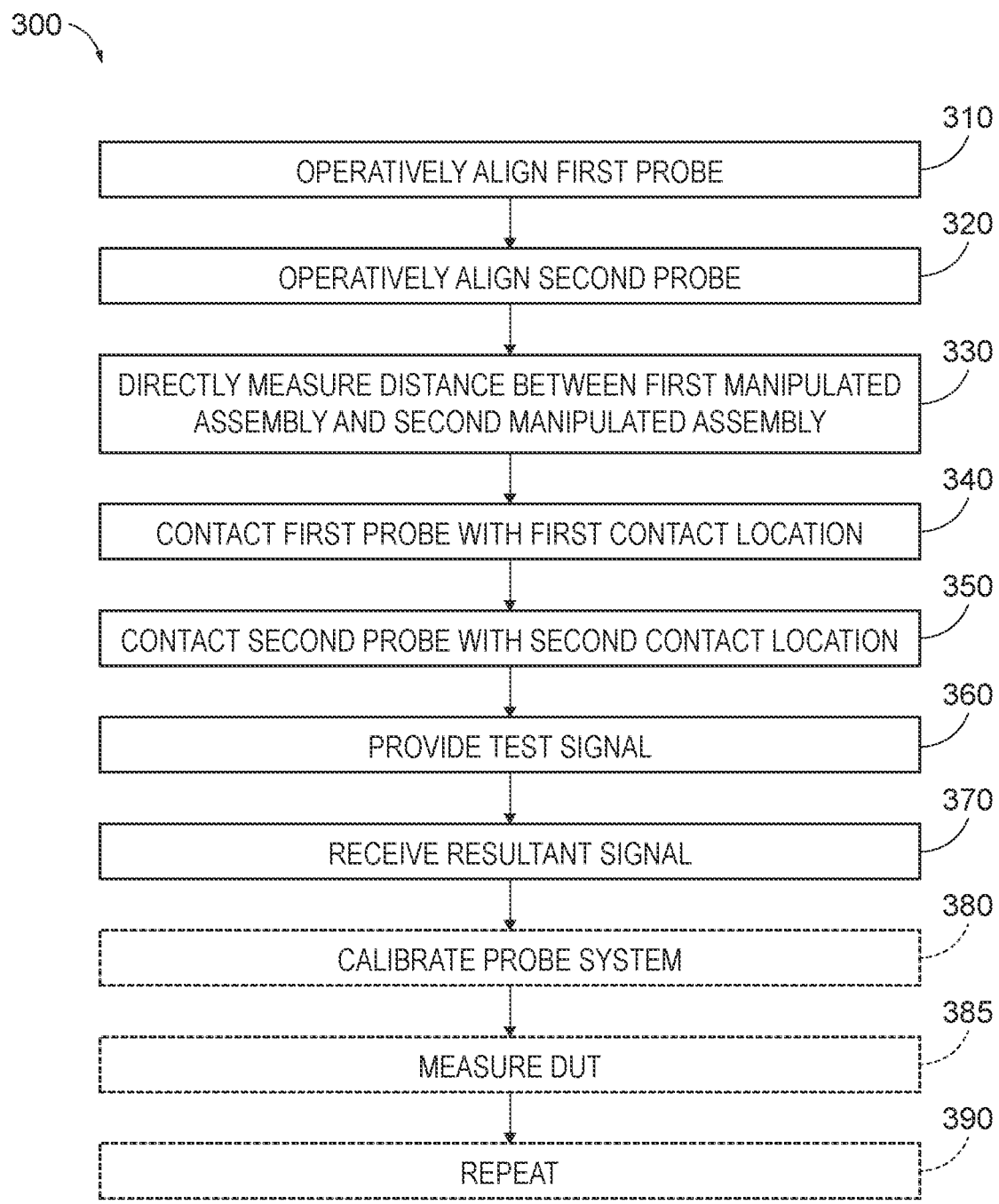
FIG. 6 is a flowchart depicting methods of utilizing a probe system according to the present disclosure.

FIG. 6 is a flowchart depicting examples of methods 300 of utilizing a probe system, according to the present disclosure, such as probe system 20 of FIGS. 1-5. Methods 300 include operatively aligning a first probe at 310 and operatively aligning a second probe at 320. Methods 300 also include directly measuring a distance between a first manipulated assembly and a second manipulated assembly at 330, contacting the first probe with a first contact location at 340, and contacting the second probe with a second contact location at 350. Methods 300 further include providing a test signal at 360 and receiving a resultant signal at 370. Methods 300 also may include calibrating the probe system at 380, measuring a DUT at 385, and/or repeating at least a portion of the methods at 390.

Operatively aligning the first probe at 310 may include operatively aligning the first probe, which may form a portion of a first manipulated assembly, with the first contact location, which may form a portion of, or be in electrical communication with, an electrical structure, examples of which are disclosed herein. Similarly, the operatively aligning the second probe at 320 may include operatively aligning the second probe, which may form a portion of a second manipulated assembly, with the second contact location, which also may form a portion of, or be in electrical communication with, the electrical structure.

The operatively aligning at 310 and the operatively aligning at 320 may be accomplished in any suitable manner. As examples, the operatively aligning at 310 may include operatively translating the first manipulated assembly relative to the electrical structure with a first manipulator and/or operatively translating the electrical structure relative to the first probe with a translation stage of a chuck that supports a substrate that includes the electrical structure.

Similarly, the operatively aligning at 320 may include operatively translating the second manipulated assembly relative to the electrical structure with a second manipulator and/or operatively translating the electrical structure relative to the second probe with the translation stage.

Directly measuring the distance between the first manipulated assembly and the second manipulated assembly at 330 may include directly measuring the distance in any suitable manner. As an example, the directly measuring may include directly measuring with a measurement device, or a single measurement device, such as measurement device 190 of FIGS. 1-3. As another example, the directly measuring at 330 may include measuring a distance between a first predetermined portion of the first manipulated assembly, such as a measurement device mount, and a second predetermined portion of the second manipulated assembly, such as a striker surface. As yet another example, the directly measuring at 330 may include directly measuring in, or within, a measurement plane that is parallel, or at least substantially parallel, to a surface of the electrical structure that includes, or defines, the first contact location and the second contact location.

It is within the scope of the present disclosure that the directly measuring at 330 may be performed with any suitable timing and/or sequencing within methods 300. As examples, the directly measuring at 330 may be performed subsequent to the operatively aligning at 310, subsequent to the operatively aligning at 320, prior to the contacting at 340, prior to the contacting at 350, subsequent to the contacting at 340, and/or subsequent to the contacting at 350.

Contacting the first probe with the first contact location at 340 and contacting the second probe with the second contact location at 350 may include contacting in any suitable manner. As examples, the contacting at 340 may include physically, mechanically, and/or electrically contacting the first probe with the first contact location, moving the first probe toward the first contact location, and/or moving the first contact location toward the first probe. Similarly, the contacting at 350 may include physically, mechanically, and/or electrically contacting the second probe with the second contact location, moving the second probe toward the second contact location, and/or moving the second contact location toward the second probe.

The contacting at 340 and/or the contacting at 350 may be performed with any suitable timing and/or sequence within methods 300. As an example, the contacting at 340 may be subsequent to the operatively aligning the first probe with the first contact location. Similarly, the contacting at 350 may be subsequent to the operatively aligning the second probe with the second contact location.

Providing the test signal at 360 may include providing any suitable test signal to the electrical structure through, via, and/or utilizing the first probe and/or the second probe. As examples, the providing at 360 may include providing the test signal at a test signal frequency of at least 50 GHz, at least 60 GHz, at least 80 GHz, at least 100 GHz, at least 150 GHz, at least 200 GHz, at most 1,000 GHz, at most 800 GHz, at most 600 GHz, at most 500 GHz, at most 400 GHz, at most 300 GHz, and/or at most 200 GHz. Additionally or alternatively, the providing at 360 may include providing the test signal from a test signal generation and analysis assembly, providing the test signal from a vector network analyzer, and/or providing the test signal from a vector network analyzer extender.

The providing at 360 may be performed with any suitable timing and/or sequence during methods 300. As examples, the providing at 360 may be performed subsequent to the contacting the first probe with the first contact location at 340 and/or subsequent to the contacting the second probe with the second contact location at 350.

Receiving the resultant signal at 370 may include receiving any suitable resultant signal from the electrical structure through, via, and/or utilizing the first probe and/or the second probe. As examples, the receiving at 370 may include receiving the resultant signal at a resultant signal frequency of at least 50 GHz, at least 60 GHz, at least 80 GHz, at least 100 GHz, at least 150 GHz, at least 200 GHz, at most 1,000 GHz, at most 800 GHz, at most 600 GHz, at most 500 GHz, at most 400 GHz, at most 300 GHz, and/or at most 200 GHz. Additionally or alternatively, the receiving at 370 may include receiving the resultant signal with a test signal generation and analysis assembly, receiving the resultant signal with a vector network analyzer, and/or receiving the resultant signal with a vector network analyzer extender.

The receiving at 370 may be performed with any suitable timing and/or sequence during methods 300. As examples, the receiving at 370 may be performed subsequent to the contacting the first probe with the first contact location, subsequent to the contacting the second probe with the second contact location, subsequent to the providing at 360, and/or responsive to the providing at 360.

Calibrating the probe system at 380 also may be referred to herein as characterizing the probe system at 380. During the calibrating at 380, the electrical structure may include, or be, a test structure, and the calibrating may include calibrating the probe system based, at least in part, on a configuration of the test structure, on the test signal that was provided during the providing at 360, on the resultant signal that was received during the receiving at 370, and/or on the distance between the first manipulated assembly and the second manipulated assembly that was measured during the directly measuring at 330. The calibrating at 380 may include calibrating in any suitable manner.

As an example, the calibrating at 380 may include utilizing the distance that was measured during the directly measuring at 330 as an input to a mathematical algorithm that is utilized to calibrate the probe system. As a more specific example, the calibrating at 380 may include performing a controlled electrical measurement on one or more predefined test structures, such as to characterize an S-parameter of the probe system. Such a calibration subsequently may be utilized, such as during the measuring at 385, to more accurately measure one or more characteristics of a DUT and/or to deconvolute, separate, and/or filter out, the impact of the probe system on the measurement that is performed during the measuring at 385, thereby permitting more accurate characterization of the DUT. Under these conditions, the distance that is determined during the measuring at 330 may be utilized, by the probe system, to more accurately characterize, determine, and/or calculate the S-parameter of the probe system.

As another more specific example, the controlled electrical measurement may be part of a Thru, Reflect, Line (TRL) measurement in which two transmission standards and one reflection standard may be measured to determine 2-port 12-term error coefficients for the probe system. During the TRL measurements, a thru test structure, an open test structure, and a short test structure may be measured. In addition, a series of transmission lines of known dimensions and varying length also may be measured. Measurement of these test structures and transmission lines may require that the distance between the first probe and the second probe be adjusted in order to measure the different transmission lines, and the accuracy of the resultant calibration of the probe system is impacted significantly by the distance between the first probe and the second probe during each measurement. Stated another way, accurate knowledge of the distance between the first probe and the second probe, such as may be provided during the measuring at 330, may permit the probe system to be more accurately calibrated. With this in mind, the calibrating at 380 may include adjusting the calibration of the probe system, adjusting the calculation of the S-parameter, and/or adjusting the calculation of the 2-port 12-term error coefficients based, at least in part, on the distance that is measured during the measuring at 330. In one example, such an adjustment may include accounting for differences between an actual distance between the first probe and the second probe and a desired, or theoretical, distance between the first probe and the second probe based, at least in part, on the measuring at 330.

As another example, and prior to the contacting at 340 and/or prior to the contacting at 350, the calibrating at 380 may include adjusting the distance between the first manipulated assembly and the second manipulated assembly. This may include adjusting to maintain the distance between the first manipulated assembly and the second manipulated assembly within a predetermined, desired, or target distance range subsequent to the contacting at 340 and also subsequent to the contacting at 350.

When the calibrating at 380 includes adjusting the distance between the first manipulated assembly and the second manipulated assembly, the adjusting may be performed in any suitable manner. As examples, the adjusting may include operatively translating the first manipulated assembly and/or operatively translating the second manipulated assembly. As additional examples, the adjusting may include manually adjusting, such as by a user of the probe system, and/or automatically adjusting, such as via an electronically controlled, or motorized, manipulator.

When the adjusting includes manually adjusting, methods 300 further may include displaying a distance offset, and the manually adjusting may be based, at least in part, on the distance offset. Examples of the distance offset include a distance between the first manipulated assembly and the second manipulated assembly and/or a difference between the distance between the first manipulated assembly and the second manipulated assembly and a desired distance between the first manipulated assembly and the second manipulated assembly.

The calibrating at 380 may be performed with any suitable timing and/or sequence during methods 300. As examples, the calibrating at 380 may be performed prior to the contacting at 340 and/or prior to the contacting at 350, such as when the calibrating at 380 includes adjusting the distance between the first manipulated assembly and the second manipulated assembly. As additional examples, the calibrating at 380 may be performed subsequent to the contacting at 340, subsequent to the contacting at 350, subsequent to the providing at 360, and/or subsequent to the receiving at 370, such as when the calibrating at 380 includes utilizing the distance between the first manipulated assembly and the second manipulated assembly as the input to the mathematical algorithm.

Measuring the DUT at 385 also may be referred to herein as characterizing the electrical structure at 385. During the measuring at 385, the electrical structure may include, or be, a DUT, and the measuring at 385 may include measuring any suitable property and/or characteristic of the DUT. As an example, the measuring at 385 may include measuring to determine, establish, and/or calculate the S-parameter of the DUT. Under these conditions, the measuring at 385 may be performed subsequent to the calibrating at 380 such that the S-parameter of the DUT may be deconvoluted from the S-parameter of the probe system, such that the S-parameter of the DUT may be quantified independently from any impact that the probe system has upon the data that is collected during the measuring at 385, and/or such that the S-parameter of the probe system is known prior to measuring the DUT.

It is within the scope of the present disclosure that the measuring at 385 may be based, at least in part, on the measuring at 330. As an example, the measuring at 330 may be utilized to mathematically account, or adjust, for variations in results obtained, during the measuring at 385, that may be caused by variations in the distance between the first probe and the second probe. As another example, the measuring at 330 may be utilized to adjust the distance between the first probe and the second probe, such as is discussed herein with reference to the calibrating at 380, in order to maintain the distance between the first probe and the second probe within a predetermined distance range during the measuring at 385.

Repeating at least the portion of the methods at 390 may include repeating any suitable portion, or step, of methods 300 in any suitable manner and/or in any suitable order. As an example, the electrical structure may be a first electrical structure, the test signal may be a first test signal, the resultant signal may be a first resultant signal, and the distance may be a first distance. Under these conditions, the repeating at 390 may include repeating the method a plurality of times to provide a plurality of respective test signals to a plurality of respective electrical structures and to receive a corresponding plurality of resultant signals from the respective plurality of electrical structures. Under these conditions, the repeating at 390 further may include performing the calibrating at 380 based upon a configuration of each of the respective test structures, the plurality of respective test signals, the plurality of respective resultant signals, and the plurality of respective distances.

As another example, and as discussed, the calibrating at 380 may be utilized to characterize the S-parameter of the probe system. Under these conditions, and subsequent to calibration of the probe system, the repeating at 390 may include repeating at least the operatively aligning at 310, the operatively aligning at 320, the directly measuring at 330, the contacting at 340, the contacting at 350, the providing at 360, and the receiving at 370 on a DUT, such as to permit the measuring at 385 to be performed accurately and/or to permit the contribution of the probe system to be deconvoluted from the contribution of the DUT.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It also is within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B, and C together, A, B and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It also is within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, also are within the scope of the present disclosure.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe system, comprising:
a probe head assembly including:
(i) a platen;
(ii) a manipulator including a manipulator mount, which is operatively attached to the platen, and a probe mount, optionally wherein the manipulator is configured to selectively and operatively translate the probe mount relative to the manipulator mount;
(iii) a vector network analyzer (VNA) extender operatively attached to the probe mount; and
(iv) a probe operatively attached to the probe mount via the VNA extender, optionally wherein the manipulator is configured to selectively and operatively translate both the VNA extender and the probe relative to the manipulator mount via motion of the probe mount;
a chuck including a support surface configured to support a substrate that includes a device under test (DUT), wherein the probe faces toward the support surface to permit selective electrical contact between the probe and the DUT; and
a vector network analyzer configured to at least one of:
(i) provide a test signal to the probe via the VNA extender; and
(ii) receive a resultant signal from the probe via the VNA extender.

A2. The probe system of paragraph A1, wherein the probe head assembly further includes a VNA extender mounting plate operatively attached to the probe mount, and further wherein the VNA extender is operatively attached to the probe mount via the VNA extender mounting plate.

A3. The probe system of paragraph A2, wherein the VNA extender is operatively attached to a surface of the VNA extender mounting plate that faces toward the support surface.

A4. The probe system of any of paragraphs A2-A3, wherein the VNA extender extends at least partially between the VNA extender mounting plate and the support surface.

A5. The probe system of any of paragraphs A1-A4, wherein the VNA extender mounting plate is directly attached to the probe mount.

A6. The probe system of any of paragraphs A1-A5, wherein the VNA extender is directly attached to a/the VNA extender mounting plate.

A7. The probe system of any of paragraphs A1-A6, wherein the probe is directly attached to the VNA extender.

A8. The probe system of any of paragraphs A1-A7, wherein the probe system further includes a waveguide that extends between and electrically and mechanically interconnects the VNA extender and the probe.

A9. The probe system of paragraph A8, wherein the manipulator is configured to selectively and operatively translate the waveguide relative to the manipulator mount via motion of the probe mount.

A10. The probe system of any of paragraphs A1-A9, wherein the manipulator is configured to operatively translate the probe mount relative to the manipulator mount along at least one, optionally at least two, and further optionally all three of an X-axis, a Y-axis, and a Z-axis optionally wherein at least one of:
(i) the X-axis is parallel, or at least substantially parallel, to the support surface;
(ii) the Y-axis is parallel, or at least substantially parallel, to the support surface and perpendicular, or at least substantially perpendicular, to the X-axis; and
(iii) the Z-axis is perpendicular, or at least substantially perpendicular, to at least one, optionally at least two, and further optionally all three of the X-axis, the Y-axis, and the support surface.

A11. The probe system of paragraph A10, wherein the manipulator further is configured to pivot the probe mount relative to the manipulator mount about at least one, optionally at least two, and further optionally all three of the X-axis, the Y-axis, and the Z-axis.

A12. The probe system of any of paragraphs A1-A11, wherein the manipulator includes at least one of:
(i) a manually actuated manipulator; and
(ii) an electrically actuated manipulator.

A13. The probe system of any of paragraphs A1-A12, wherein the probe system further includes a data cable that electrically interconnects the vector network analyzer and the VNA extender.

A14. The probe system of paragraph A13, wherein the data cable defines a first signal transmission length between the vector network analyzer and the VNA extender, wherein the probe system further defines a second signal transmission length between the VNA extender and a probe tip of the probe, and further wherein the second signal transmission length is less than a threshold fraction of the first signal transmission length.

A15. The probe system of paragraph A14, wherein the threshold fraction is less than 10%, less than 5%, less than 1%, less than 0.5%, less than 0.1%, less than 0.05%, or less than 0.01% of the first signal transmission length.

A16. The probe system of any of paragraphs A1-A15, wherein the VNA extender is configured to receive the test signal from the vector network analyzer at a first frequency and to provide the test signal to the probe at a second frequency that is greater than the first frequency.

A17. The probe system of paragraph A16, wherein the first frequency is at most 10 gigahertz (GHz), at most 20 GHz, at most 30 GHz, at most 40 GHz, at most 50 GHz, at most 60 GHz, at most 70 GHz, or at most 80 GHz.

A18. The probe system of any of paragraphs A16-A17, wherein the second frequency is at least one of:
(i) at least 50 GHz, at least 60 GHz, at least 70 GHz, at least 80 GHz, at least 90 GHz, at least 100 GHz, at least 200 GHz, or at least 300 GHz; and
(ii) at most 1,000 GHz, at most 800 GHz, at most 600 GHz, at most 500 GHz, at most 400 GHz, at most 300 GHz, or at most 200 GHz.

A19. The probe system of any of paragraphs A1-A18, wherein the probe system further includes a lower enclosure at least partially defining an enclosed volume, wherein the support surface is positioned within the enclosed volume.

A20. The probe system of paragraph A19, wherein the probe system further includes an upper enclosure at least partially defining the enclosed volume, wherein the upper enclosure includes an aperture, wherein the manipulator and the VNA extender are external to the enclosed volume, and further wherein the probe extends through the aperture such that the probe tip of the probe is positioned within the enclosed volume.

B1. A probe system, comprising:
a chuck including a support surface configured to support a substrate that includes a device under test (DUT);
a probe head assembly, including:
(i) a platen;
(ii) a first manipulator operatively attached to the platen;
(iii) a first manipulated assembly including a first probe configured to contact the DUT, wherein the first manipulated assembly is operatively attached to the first manipulator and optionally configured to operatively translate relative to the platen via actuation of the first manipulator;

(iv) a second manipulator operatively attached to the platen; and (v) a second manipulated assembly including a second probe configured to contact the DUT, wherein the second manipulated assembly is operatively attached to the second manipulator and optionally configured to operatively translate relative to the platen via actuation of the second manipulator, optionally wherein the first manipulator and the second manipulator are configured to be independently actuated to operatively translate the first manipulated assembly and the second manipulated assembly relative to one another; and a measurement device configured to directly measure a distance between the first manipulated assembly and the second manipulated assembly.

B2. The probe system of paragraph B1, wherein the measurement device includes at least one of:
(i) a micrometer;
(ii) a capacitive probe; and
(iii) an interferometer.

B3. The probe system of any of paragraphs B1-B2, wherein the measurement device is an electronic measurement device.

B4. The probe system of any of paragraphs B1-B3, wherein the measurement device includes a display configured to indicate the distance between the first manipulated assembly and the second manipulated assembly.

B5. The probe system of any of paragraphs B1-B4, wherein the first manipulated assembly includes a measurement device mount, wherein the measurement device is operatively attached to the measurement device mount.

B6. The probe system of paragraph B5, wherein the second manipulated assembly includes a striker surface, wherein the measurement device is configured to operatively contact the striker surface to measure the distance between the first manipulated assembly and the second manipulated assembly, optionally wherein the distance between the first manipulated assembly and the second manipulated assembly includes, is based upon, or is, a distance between the measurement device mount and the striker surface.

B7. The probe system of any of paragraphs B1-B6, wherein the measurement device extends between, and operatively contacts, both the first manipulated assembly and the second manipulated assembly.

B8. The probe system of any of paragraphs B1-B7, wherein the measurement device is a single measurement device.

B9. The probe system of any of paragraphs B1-B8, wherein the measurement device is not integral with either the first manipulator or the second manipulator.

B10. The probe system of any of paragraphs B1-B9, wherein the first probe includes at least one of:
(i) a first needle probe;
(ii) a first test head; and
(iii) a first probe head including a plurality of first probes.

B11. The probe system of any of paragraphs B1-B10, wherein the second probe includes at least one of:
(i) a second needle probe;
(ii) a second test head; and
(iii) a second probe head including a plurality of second probes.

B12. The probe system of any of paragraphs B1-B11, wherein the first manipulator is configured to operatively translate the first manipulated assembly relative to the platen along at least one, optionally at least two, and further optionally all three of an X-axis, a Y-axis, and a Z-axis, optionally wherein at least one of:
(i) the X-axis is parallel, or at least substantially parallel, to the support surface;
(ii) the Y-axis is parallel, or at least substantially parallel, to the support surface and perpendicular, or at least substantially perpendicular, to the X-axis; and
(iii) the Z-axis is perpendicular, or at least substantially perpendicular, to at least one, optionally at least two, and further optionally all three of the X-axis, the Y-axis, and the support surface.

B13. The probe system of paragraph B12, wherein the first manipulator further is configured to pivot the first manipulated assembly relative to the platen about at least one, optionally at least two, and further optionally all three of the X-axis, the Y-axis, and the Z-axis.

B14. The probe system of any of paragraphs B1-B13, wherein the first manipulator includes at least one of:
(i) a manually actuated second manipulator; and
(ii) an electrically actuated second manipulator.

B15. The probe system of any of paragraphs B1-B14, wherein the second manipulator is configured to operatively translate the second manipulated assembly relative to the platen along at least one, optionally at least two, and further optionally all three of an/the X-axis, a/the Y-axis, and a/the Z-axis, optionally wherein at least one of:
(i) the X-axis is parallel, or at least substantially parallel, to the support surface;
(ii) the Y-axis is parallel, or at least substantially parallel, to the support surface and perpendicular, or at least substantially perpendicular, to the X-axis; and
(iii) the Z-axis is perpendicular, or at least substantially perpendicular, to at least one, optionally at least two, and further optionally all three of the X-axis, the Y-axis, and the support surface.

B16. The probe system of paragraph B15, wherein the second manipulator further is configured to pivot the second manipulated assembly relative to the platen about at least one, optionally at least two, and further optionally all three of the X-axis, the Y-axis, and the Z-axis.

B17. The probe system of any of paragraphs B1-B16, wherein the second manipulator includes at least one of:
(i) a manually actuated second manipulator; and
(ii) an electrically actuated second manipulator.

B18. The probe system of any of paragraphs B1-B17, wherein the probe system further includes a controller programed to control the operation of at least a portion of the probe system.

B19. The probe system of paragraph B18, wherein the measurement device further is configured to generate a distance signal indicative of the distance between the first manipulated assembly and the second manipulated assembly and to provide the distance signal to the controller.

B20. The probe system of paragraph B19, wherein the probe system further includes a signal conveyance structure configured to convey the distance signal from the measurement device to the controller, optionally wherein the signal conveyance structure includes at least one of:
(i) a signal conveyance wire;
(ii) a signal conveyance fiber optic cable;
(iii) a wired signal conveyance structure; and
(iv) a wireless signal conveyance structure.

B21. The probe system of any of paragraphs B18-B20, wherein the controller is programmed to perform any suitable portion of any of the methods of any of paragraphs C1-C22.

C1. A method of utilizing a probe system, the method comprising:

operatively aligning a first probe of a first manipulated assembly with a first contact location of an electrical structure;

operatively aligning a second probe of a second manipulated assembly with a second contact location of the electrical structure;

directly measuring, with a measurement device, a distance between the first manipulated assembly and the second manipulated assembly;

contacting the first probe with the first contact location;

contacting the second probe with the second contact location;

providing a test signal to the electrical structure;

receiving a resultant signal from the electrical structure; and characterizing at least one of the probe system and the electrical structure based, at least in part, on at least one of a configuration of the electrical structure, the test signal, the resultant signal, and the distance between the first manipulated assembly and the second manipulated assembly.

C2. The method of paragraph C1, wherein the operatively aligning the first probe with the first contact location includes at least one of:

(i) operatively translating the first manipulated assembly relative to the electrical structure with a first manipulator; and (ii) operatively translating the electrical structure relative to the first probe with a translation stage of a chuck that supports a substrate that includes the electrical structure.

C3. The method of any of paragraphs C1-C2, wherein the operatively aligning the second probe with the second contact location includes at least one of:

(i) operatively translating the second manipulated assembly relative to the electrical structure with a second manipulator; and (ii) operatively translating the electrical structure relative to the second probe with a/the translation stage of a/the chuck that supports a/the substrate that includes the electrical structure.

C4. The method of any of paragraphs C1-C3, wherein the directly measuring includes measuring a distance between a first predetermined portion of the first manipulated assembly and a second predetermined portion of the second manipulated assembly.

C5. The method of any of paragraphs C1-C4, wherein the directly measuring includes directly measuring in a measurement plane that is parallel, or at least substantially parallel, to a surface of the electrical structure that includes the first contact location and the second contact location.

C6. The method of any of paragraphs C1-C5, wherein the contacting the first probe with the first contact location includes at least one of:

(i) physically contacting the first probe with the first contact location;

(ii) mechanically contacting the first probe with the first contact location;

(iii) electrically contacting the first probe with the first contact location;

(iv) moving the first probe toward the first contact location; and (v) moving the first contact location toward the first probe.

C7. The method of any of paragraphs C1-C6, wherein the contacting the second probe with the second contact location includes at least one of:

(i) physically contacting the second probe with the second contact location;

(ii) mechanically contacting the second probe with the second contact location;

(iii) electrically contacting the second probe with the second contact location;

(iv) moving the second probe toward the second contact location; and (v) moving the second contact location toward the second probe.

C8. The method of any of paragraphs C1-C7, wherein the providing the test signal includes at least one of:

(i) providing the test signal at a test signal frequency of at least 50 GHz, at least 60 GHz, at least 80 GHz, at least 100 GHz, at least 150 GHz, or at least 200 GHz;

(ii) providing the test signal at a test signal frequency of at most 1,000 GHz, at most 800 GHz, at most 600 GHz, at most 500 GHz, at most 400 GHz, at most 300 GHz, or at most 200 GHz;

(iii) providing the test signal from a test signal generation and analysis assembly;

(iv) providing the test signal from a vector network analyzer;

(v) providing the test signal from a vector network analyzer extender;

(vi) providing the test signal with the first probe; and (vii) providing the test signal with the second probe.

C9. The method of any of paragraphs C1-C8, wherein the receiving the resultant signal includes at least one of:

(i) receiving the resultant signal at a resultant signal frequency of at least 50 GHz, at least 60 GHz, at least 80 GHz, at least 100 GHz, at least 150 GHz, or at least 200 GHz;

(ii) receiving the resultant signal at a resultant signal frequency of at most 1,000 GHz, at most 800 GHz, at most 600 GHz, at most 500 GHz, at most 400 GHz, at most 300 GHz, or at most 200 GHz;

(iii) receiving the resultant signal with a test signal generation and analysis assembly;

(iv) receiving the resultant signal with a vector network analyzer;

(v) receiving the resultant signal with a vector network analyzer extender;

(vi) receiving the resultant signal with the first probe; and (vii) receiving the resultant signal with the second probe.

C10. The method of any of paragraphs C1-C9, wherein the characterizing includes calibrating the probe system.

C10.1 The method of paragraph C10, wherein the calibrating includes utilizing the distance between the first manipulated assembly and the second manipulated assembly as an input to a mathematical algorithm utilized to calibrate the probe system.

C11. The method of any of paragraphs C10-C10.1, wherein the calibrating includes adjusting, prior to the contacting the first probe with the first contact location and also prior to the contacting the second probe with the second contact location, the distance between the first manipulated assembly and the second manipulated assembly to maintain the distance between the first manipulated assembly and the second manipulated assembly within a predetermined threshold distance range subsequent to the contacting the first probe with the first contact location and also subsequent to the contacting the second probe with the second contact location.

C12. The method of paragraph C11, wherein the adjusting includes at least one of:
(i) operatively translating the first manipulated assembly; and
(ii) operatively translating the second manipulated assembly.

C13. The method of any of paragraphs C11-C12, wherein the adjusting includes automatically adjusting utilizing at least one motorized manipulator.

C14. The method of any of paragraphs C11-C13, wherein the adjusting includes manually adjusting.

C15. The method of paragraph C14, wherein the method further includes displaying a distance offset, wherein the manually adjusting includes manually adjusting based, at least in part, on the distance offset, and further wherein the distance offset includes at least one of:
(i) the distance between the first manipulated assembly and the second manipulated assembly; and
(ii) a difference between the distance between the first manipulated assembly and the second manipulated assembly and a desired distance between the first manipulated assembly and the second manipulated assembly.

C16. The method of any of paragraphs C1-C15, wherein the directly measuring at least one of:
(i) is performed subsequent to the operatively aligning the first probe;
(ii) is performed subsequent to the operatively aligning the second probe;
(iii) is performed prior to the contacting the first probe;
(iv) is performed prior to the contacting the second probe;
(v) is performed subsequent to the contacting the first probe; and
(vi) is performed subsequent to the contacting the second probe.

C17. The method of any of paragraphs C1-C16, wherein at least one of:
(i) the contacting the first probe with the first contact location is subsequent to the operatively aligning the first probe with the first contact location; and
(ii) the contacting the second probe with the second contact location is subsequent to the operatively aligning the second probe with the second contact location.

C18. The method of any of paragraphs C1-C17, wherein the providing the test signal is subsequent to the contacting the first probe with the first contact location and also subsequent to the contacting the second probe with the second contact location.

C19. The method of any of paragraphs C1-C18, wherein the utilizing is prior to at least one, and optionally both, of the contacting the first probe with the first contact location and the contacting the second probe with the second contact location.

C20. The method of any of paragraphs C1-C19, wherein the utilizing is subsequent to at least one, and optionally both, of the contacting the first probe with the first contact location and the contacting the second probe with the second contact location.

C21. The method of any of paragraphs C1-C20, wherein the electrical structure includes at least one of an open test structure, a short test structure, a thru test structure, an electrically conductive trace, or line, and a device under test, or DUT.

C22. The method of any of paragraphs C1-C21, wherein the electrical structure is a first electrical structure, wherein the test signal is a first test signal, wherein the distance is a first distance, wherein the resultant signal is a first resultant signal, and further wherein the method includes repeating the method a plurality of times to provide a plurality of respective test signals to a respective plurality of respective electrical structures and to receive a corresponding plurality of respective resultant signals from the respective plurality of electrical structures, wherein the utilizing is based, at least in part, on a configuration of each of the respective plurality of electrical structures, the plurality of respective test signals, the plurality of respective resultant signals, and a plurality of respective distances between the first manipulated assembly and the second manipulated assembly.

C23. The method of any of paragraphs C1-C22, wherein the method is performed utilizing the probe system of any of paragraphs B1-B21.

INDUSTRIAL APPLICABILITY

The probe systems and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe system, comprising:
a probe head assembly including:
(i) a platen;
(ii) a manipulator including a manipulator mount, which is operatively attached to the platen, and a probe mount, wherein the manipulator is configured to selectively and operatively translate the probe mount relative to the manipulator mount;
(iii) a vector network analyzer (VNA) extender operatively attached to the probe mount; and
(iv) a probe operatively attached to the probe mount via the VNA extender, wherein the manipulator is configured to selectively and operatively translate both the VNA extender and the probe relative to the manipulator mount via motion of the probe mount;
a chuck including a support surface configured to support a substrate that includes a device under test (DUT), wherein the probe faces toward the support surface to permit selective electrical contact between the probe and the DUT; and a vector network analyzer configured to at least one of:
  (i) provide a test signal to the probe via the VNA extender; and
  (ii) receive a resultant signal from the probe via the VNA extender.

2. The probe system of claim 1, wherein the probe head assembly further includes a VNA extender mounting plate operatively attached to the probe mount, and further wherein the VNA extender is operatively attached to the probe mount via the VNA extender mounting plate.

3. The probe system of claim 2, wherein the VNA extender extends at least partially between the VNA extender mounting plate and the support surface.

4. The probe system of claim 2, wherein the VNA extender is operatively attached to a surface of the VNA extender mounting plate that faces toward the support surface.

5. The probe system of claim 2, wherein the VNA extender mounting plate is directly attached to the probe mount.

6. The probe system of claim 5, wherein the VNA extender is directly attached to the VNA extender mounting plate.

7. The probe system of claim 6, wherein the probe is directly attached to the VNA extender.

8. The probe system of claim 1, wherein the probe system further includes a waveguide that extends between and electrically and mechanically interconnects the VNA extender and the probe.

9. The probe system of claim 8, wherein the manipulator is configured to selectively and operatively translate the waveguide relative to the manipulator mount via motion of the probe mount.

10. The probe system of claim 1, wherein the probe system further includes a data cable that electrically interconnects the vector network analyzer and the VNA extender.

11. The probe system of claim 10, wherein the data cable defines a first signal transmission length between the vector network analyzer and the VNA extender, wherein the probe system further defines a second signal transmission length between the VNA extender and a probe tip of the probe, and further wherein the second signal transmission length is less than 10% of the first signal transmission length.

12. The probe system of claim 1, wherein the manipulator is configured to operatively translate the probe mount relative to the manipulator mount along an X-axis, a Y-axis, and a Z-axis.

13. The probe system of claim 1, wherein the VNA extender is configured to receive the test signal from the vector network analyzer at a first frequency and to provide the test signal to the probe at a second frequency that is greater than the first frequency.

14. The probe system of claim 13, wherein the first frequency is at most 80 GHz.

15. The probe system of claim 14, wherein the second frequency is at least 50 GHz and at most 1,000 GHz.

16. The probe system of claim 1, wherein the probe system further includes a lower enclosure at least partially defining an enclosed volume, wherein the support surface is positioned within the enclosed volume.

17. The probe system of claim 16, wherein the probe system further includes an upper enclosure at least partially defining the enclosed volume, wherein the upper enclosure includes an aperture, wherein the manipulator and the VNA extender are external to the enclosed volume, and further wherein the probe extends through the aperture such that the probe tip of the probe is positioned within the enclosed volume.

* * * * *